(12) United States Patent
Ilchev

(10) Patent No.: US 8,476,539 B2
(45) Date of Patent: Jul. 2, 2013

(54) JUNCTION BOX FOR CONNECTING A SOLAR CELL, ELECTRICAL DIODE, GUIDING ELEMENT AND FIXING MEANS

(75) Inventor: Lazar Ilchev, Sofia (BG)

(73) Assignee: Tyco Electronics AMP GmbH, Bensheim (DE)

( * ) Notice: Subject to any disclaimer, the term of this patent is extended or adjusted under 35 U.S.C. 154(b) by 266 days.

(21) Appl. No.: 12/830,035

(22) Filed: Jul. 2, 2010

(65) Prior Publication Data

US 2011/0000709 A1    Jan. 6, 2011

(30) Foreign Application Priority Data

Jul. 3, 2009    (EP) ..................................... 09164561

(51) Int. Cl.
*H01R 13/40*    (2006.01)
*H01B 5/00*    (2006.01)

(52) U.S. Cl.
USPC ........ 174/520; 174/535; 174/542; 174/126.1; 439/873

(58) Field of Classification Search
USPC ................... 136/243, 244, 252; 174/50, 520, 174/126.1, 136.1, 535, 542; 439/626, 67, 439/329, 527, 574, 377, 836, 837, 830, 839, 439/863, 76.1
See application file for complete search history.

(56) References Cited

U.S. PATENT DOCUMENTS

| | | | |
|---|---|---|---|
| 5,118,361 A | 6/1992 | Fraas | |
| 5,743,747 A | 4/1998 | Sobhani | |
| 5,928,437 A | 7/1999 | Dillard | |
| 7,291,036 B1 * | 11/2007 | Daily et al. | 439/487 |
| 7,618,265 B2 * | 11/2009 | Rueggen et al. | 439/76.1 |
| 7,960,650 B2 * | 6/2011 | Richter et al. | 174/50 |
| 8,033,859 B2 * | 10/2011 | Giefers | 439/441 |
| 2005/0230140 A1 * | 10/2005 | Higashikozono et al. | 174/59 |

FOREIGN PATENT DOCUMENTS

| | | |
|---|---|---|
| EP | 1777754 B1 | 12/2009 |
| EP | 1729369 B1 | 5/2011 |
| GB | 2350497 A | 12/2000 |
| WO | 2009045318 A1 | 4/2009 |
| WO | 2008095669 A1 | 4/2011 |

OTHER PUBLICATIONS

European Patent Search Report cited in application No. 09164561.4 dated Nov. 11, 2009, 7 pages.

* cited by examiner

*Primary Examiner* — Angel R Estrada
*Assistant Examiner* — Dimary Lopez
(74) *Attorney, Agent, or Firm* — Barley Snyder

(57) ABSTRACT

A junction box for connecting a solar cell, having a housing; a diode; and a conductive foil strip electrical contact. The housing includes a base plate with a receiving passageway that extends along a slide direction. The receiving passageway opens along an upper side of the base plate through a receiving slot.

21 Claims, 12 Drawing Sheets

JUNCTION BOX FOR CONNECTING A SOLAR CELL, ELECTRICAL DIODE, GUIDING ELEMENT AND FIXING MEANS

CROSS-REFERENCE TO RELATED APPLICATIONS

This application claims priority under 35 U.S.C. §119 to European Patent Application No. 09164561.4, filed Jul. 3, 2009.

FIELD OF THE INVENTION

The invention relates to a junction box, in particular, to a junction box for connecting to a solar cell and having a diode.

BACKGROUND

International patent application WO 2009/045318 A1 discloses a low profile photovoltaic box that is used for connecting solar cells. The box includes diodes that are disposed on heat sinks that are used for electrically connecting conductors of the solar cells.

SUMMARY

An aspect of the present invention is to provide a junction box for connecting a solar cell which has an improved diode. The junction box includes a housing and a diode. The diode has electrical contacts formed of an electrically conductive foil strip.

BRIEF DESCRIPTION OF THE DRAWINGS

The invention will be explained in greater detail by describing a exemplary embodiments with reference to the follow figures of which.

DETAILED DESCRIPTION OF THE EMBODIMENTS

The invention will now be described more fully hereinafter with reference to the accompanying drawings, in which embodiments of the invention are shown. It is to be understood that many alterations and changes can be made by those skilled in the art without deviating from the spirit and the scope of the invention. This description is not to be taken in a limiting sense, but is made for the purpose of illustrating the general principles of the invention.

Figure 1:
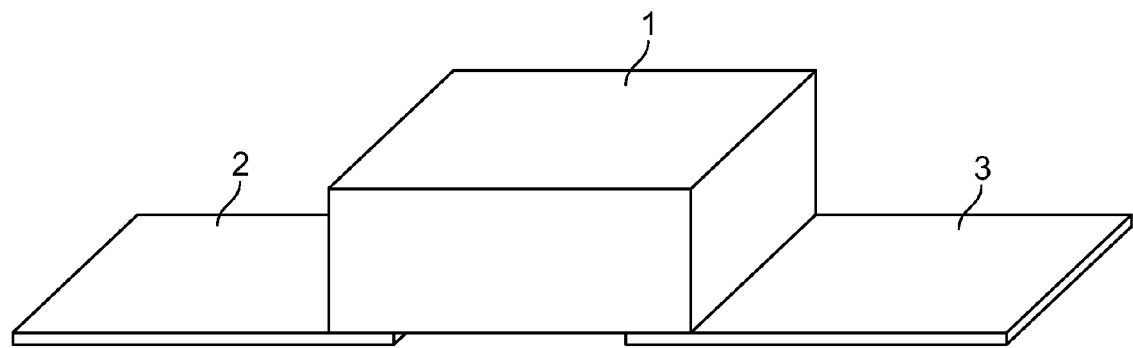
FIG. 1 is a perspective view of a r diode with two foil strips according to the invention.

FIG. 1 illustrates a diode 1 which is, in this example, a Schottky diode with a first and a second electrical contact formed of electrically conductive foil strips 2, 3. The foil strips 2, 3 may be integrally formed with the diode 1 or the diode 1 may be electrically connected, for example, by solder contacts to the foil strips 2, 3. Depending on the embodiment, the diode 1 may include only one electrically conductive foil strip 2, 3, whereby the other electrical contact is constructed as a wire conductor. Using electrically conductive foil strips 2, 3 as electrical contacts provides the advantage that the foil strip 2, 3 is less sensitive with respect to bending processes during the production of a junction box. The foil strips 2, 3 may have a width of 5 to 6 mm. Bending the foil strip 2, 3 causes less stress on the diode 1 in comparison to bending a wire conductor connection of the diode 1.

By using the foil strips 2, 3 as electrical connection, it is possible to bend the foil strips 2, 3 as it may be advantageous. The diodes 1 can be arranged in different orientations, whereby the foil strips 2, 3 are bent, respectively. Therefore, foil strips 2, 3 provide more flexibility in comparison to wire conductors. The foil strip 2, 3 is made of any kind of material that is electrically conductive and suitable for undergoing several bending cycles without the risk of being damaged. Further, the foil strip 2, 3 material is also characterized by its bending properties, which are such that once bent from an original shape into a specific shape, it will remain in said specific shape without the risk of it self-returning to its said original shape. A preferable thickness of the foil strip from the point of view of material optimization is between 0.1 to 1.0 mm, more preferably 0.2 to 0.6 mm from the point of view of reducing the force during the bending process.

The width of the foil strip 2, 3 is not necessarily determined by the width of the diode 1 as such. Accordingly, the width of the foil strip 2, 3 can either be greater or smaller than the width of a diode body depending on the circumstances. For example, in order to further improve the heat distribution the foil strip width can be chosen to be larger than the width of the diode body.

Figure 2:
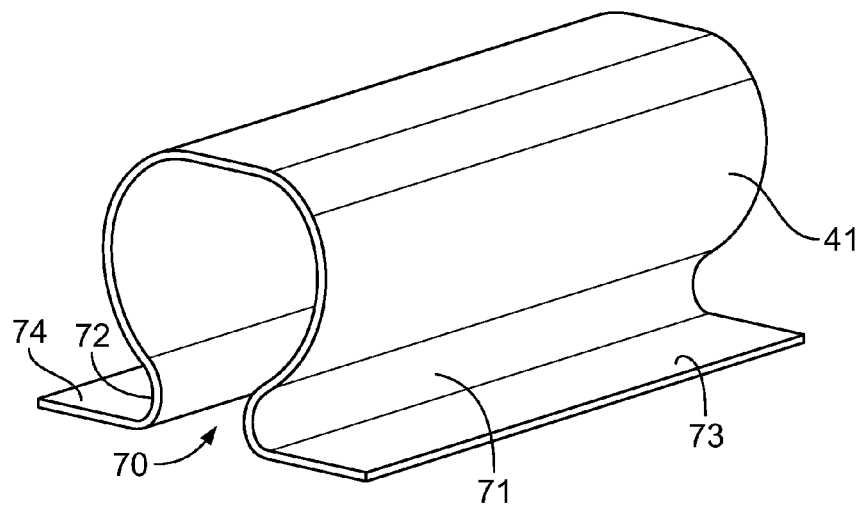
FIG. 2 is a perspective view of a clamp according to the invention.

FIG. 2 shows a third clamp 41 (a first and a second clamp 38, 39 will be described with reference to FIG. 8) with basically an Ω-shape, whereby the third clamp 41 is used for fixing foil strips 2, 3 to guides. The third clamp 41 has a shape of a cylindrical sleeve with a sleeve receiving slot 70, whereby opposite sidewalls 71, 72 adjoining the receiving slot 70 are bent away from the receiving slot 70. The receiving slot 70 is arranged in parallel to a longitudinal axis of the third clamp 41. End parts 73, 74 of the side walls 71, 72 are arranged in one plane. The third clamp 41 has a cross-sectional shape of said letter Ω(omega) perpendicular to the longitudinal axis. In another embodiment, a more simple design, the third clamp 41 may have a cross-sectional shape in the form of the letter U.

Using the third clamp 41 with foil strips 2, 3 reduces the costs of a junction box. An advantage of using the foil strips is that in vertical direction the bended foil strip is small. Therefore, the foil strip density on the junction box can be increased. Another advantage of the foil strip is that the foil strip may function as a cooling device, by providing a large cooling surface for the diode 1. Therefore, the cooling surface of diode 1 is improved. Additionally, the foil strip 2, 3 can easily be guided by bending the foil strip over a guide 4, which is shown in FIG. 3.

Figure 3:
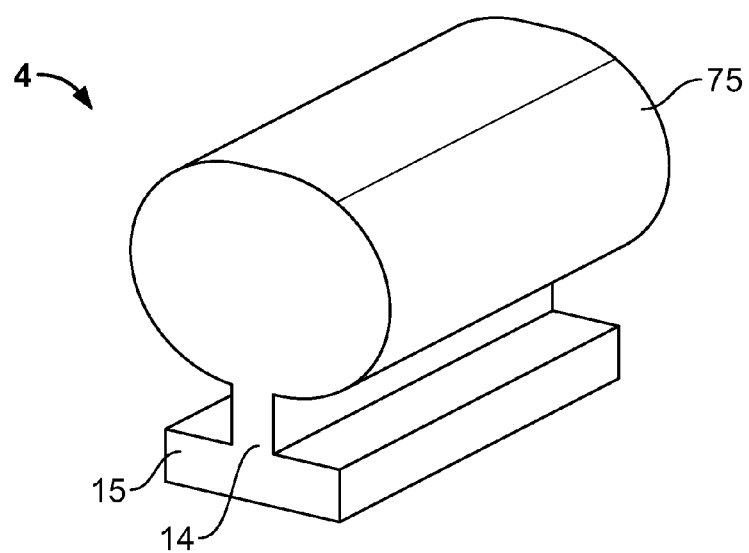
FIG. 3 is a perspective view of a guide according to the invention.
Figure 4:
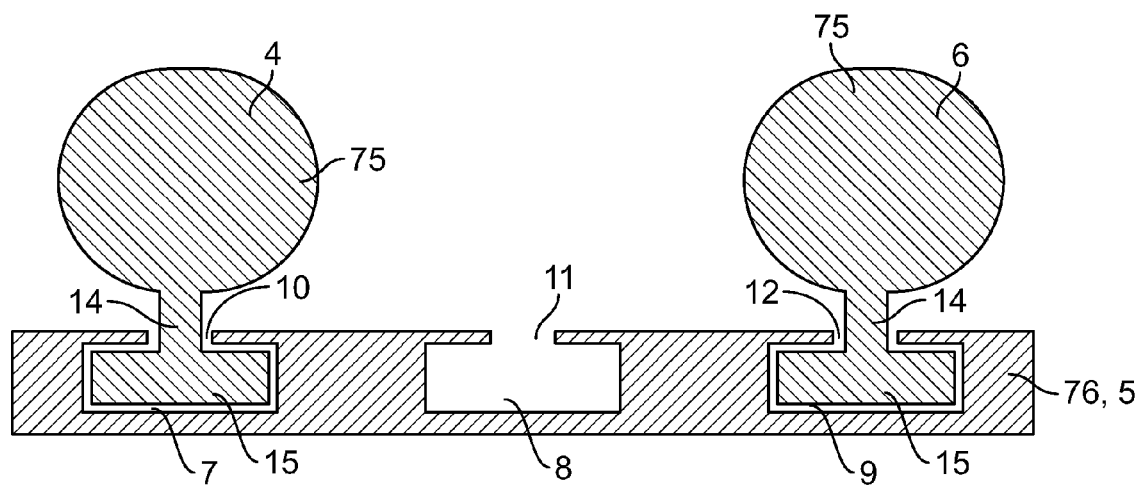
FIG. 4 is a sectional view of a housing with a T-rail system according to the invention.

FIG. 3 shows a guide 4 that can be used for guiding and fixing the foil strips 2, 3. The guide 4 includes a spherical guiding surface 75, such as a cylindrical surface. The foil strip 2, 3 can be bent over the spherical guiding surface 75 lying at least partially on the guiding surface 75 of the guide 4. The guide 4 may have a cylindrical shape with a diameter of about 6 to 8 mm with a length of 10 mm. The guide 4 may be part integrally formed with the housing or secured to the housing of the junction box in such a way that the guide 4 can be removed (as schematically shown in FIG. 4). The guide 4, as shown in FIG. 3, further includes a foot plate 15 connected to the guiding surface 75 via a bar 14.

FIG. 4 shows a schematic cross-sectional view of a section of a housing 5 of a junction box. The housing 5 includes a base plate 76 in which parallel receiving passageways 7, 8, 9 are arranged. The receiving passageways 7, 8, 9 have a rectangular shape, whereby a receiving slot 10, 11, 12 is arranged on an upper side. The first, second, third receiving passageway 7, 8, 9 extend along a predetermined distance and the receiving slots 10, 11, 12 extend along the predetermined distance, as well, whereby the first, second and third receiving slot 10, 11, 12 are arranged in parallel. FIG. 4 shows the guide 4 and a second guide 6. The two guides 4, 6 have the same shape with guiding surfaces 75 for guiding foil strips 2, 3 having a cylindrical shape whereby the guiding surfaces 75 are connected to said foot plate 15 via said bar 14. The foot plate 15 is guided in the respective receiving passageways 7, 8, 9. Therefore, the guides 4, 6 are fixed to the housing 5 in a slidable manner. The slidable connection between the guides 4, 6 is a T-rail system, which allows a movement of the guides 4, 6 along the receiving slots 10, 11, 12.

Figure 5:
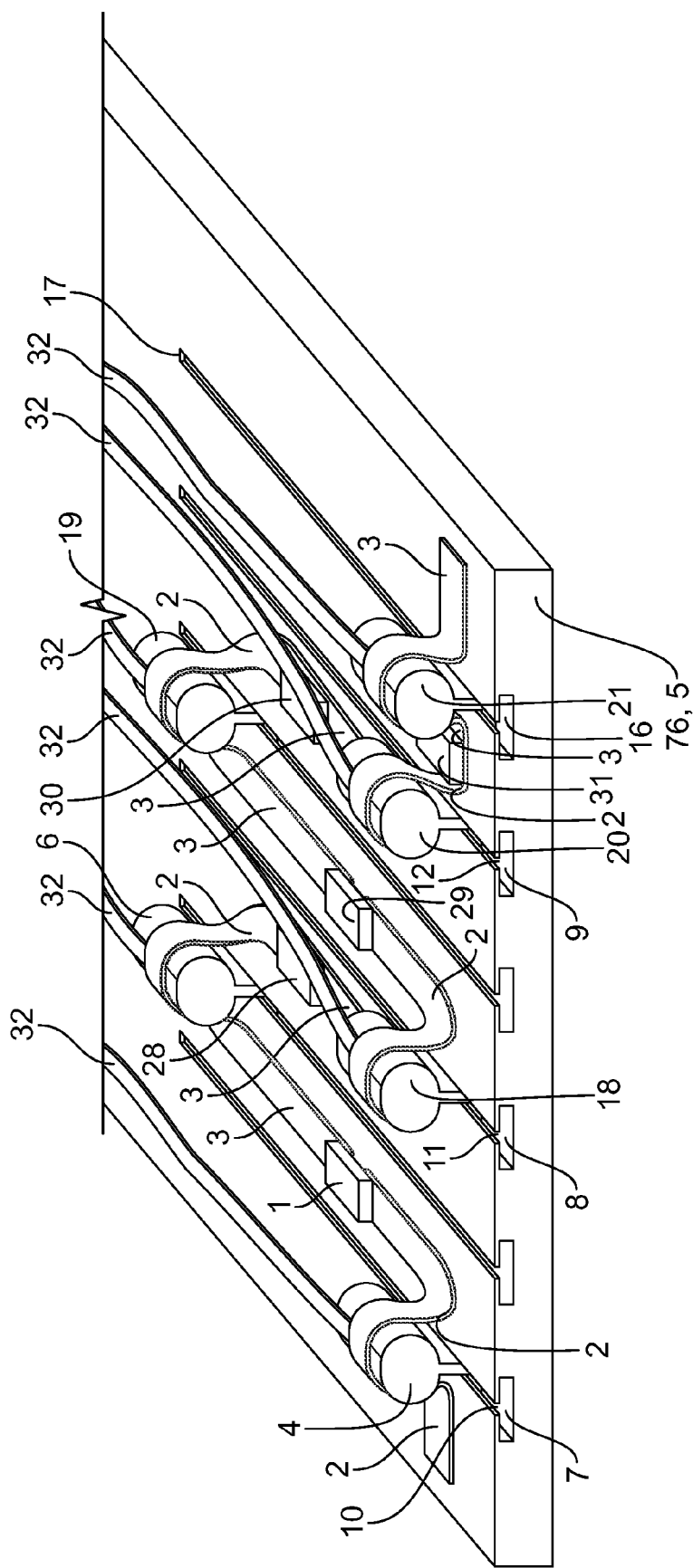
FIG. 5 is a perspective view of a section of a junction box with several guides according to the invention.

FIG. 5 depicts a schematic view of a section of a junction box 35 for connecting solar cells (not shown) with a housing 5, whereby only a base plate 76 is depicted. The housing 5 includes four parallel receiving passageways 7, 8, 9, 16 with four receiving slots 10, 11, 12, 17. In each of the receiving passageways 7, 8, 9, 16, a guide 4, 6, 18 to 21 is arranged in a moveable manner. Furthermore, a first, second, third, fourth and a fifth diode 1, 28 to 31 are arranged, whereby each diode 1, 28 to 31 includes a first and a second foil strip 2, 3. The foil strips 2, 3 of the diodes are guided to respective guides 4, 6, 18 to 21. The foil strips 2, 3 are secured to the guides 4, 6, 18 to 21. Additionally, foil conductors 32 of solar cells are connected to the foil strips 2, 3 on the guides 4, 6, 18 to 21.

The first foil strip 2 that is secured to the guide 4 and the first foil strip 2 that is fixed to the sixth guide 21 are connected to contact points of the junction box 35. The contact points are disposed for being connected to electrical conductors to deliver current that is produced by the solar cells.

Figure 6:
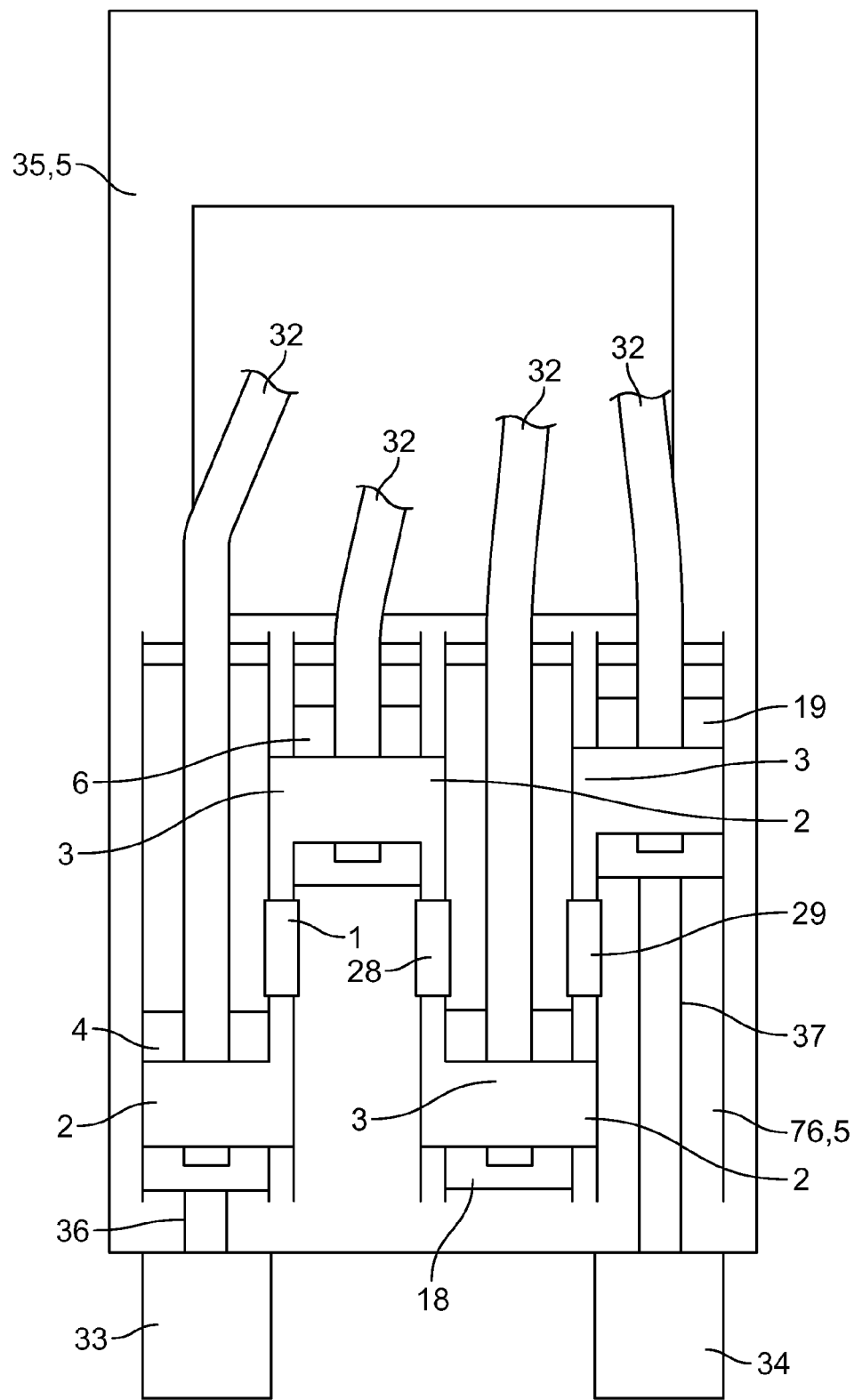
FIG. 6 is a top view of a further embodiment of a junction box according to the invention.

FIG. 6 depicts a top view of a further embodiment of a junction box 35, which comprises three diodes 1, 28, 29 with foil strips 2, 3 whereby the foil strips 2, 3 are fixed to guides 4, 6, 18, 19. In the depicted embodiment, four guides 4, 6, 18, 19 are arranged. The first guide 4 and the fourth guide 19 are connected via conductor elements with contact points 33, 34. The three diodes are arranged with a small side on a base plate 76 of the housing 5.

The guides 4, 6, 18, 19 of the embodiment of FIG. 6 may be fixed to the housing 5 in a moveable manner or in a slidable manner. Each diode 1, 28, 29 includes a first and a second foil strip 2, 3, whereby the foil strips 2, 3 of a diode are guided to different guides 4, 6, 18, 19.

Figure 7:
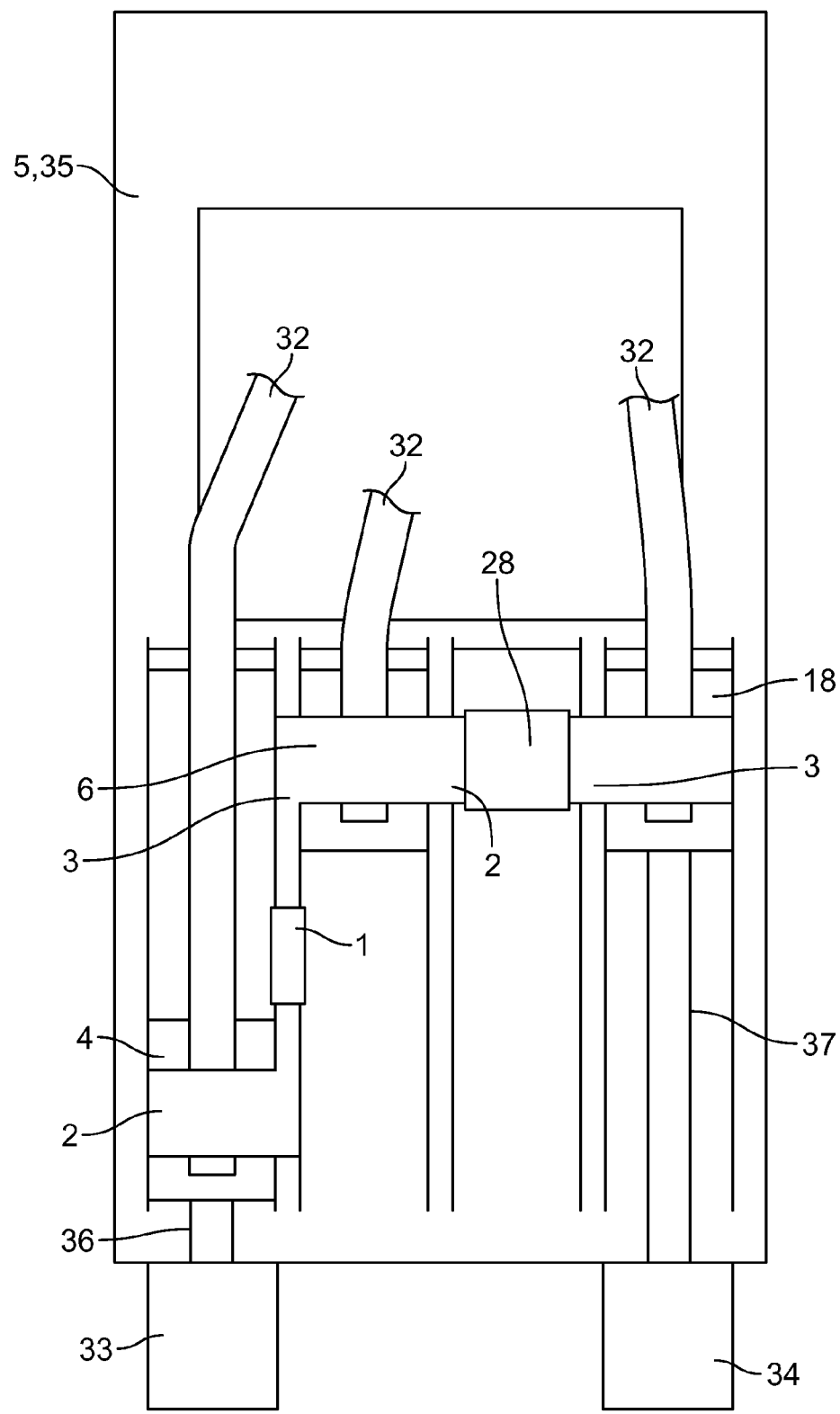
FIG. 7 is a top view showing another embodiment of a junction box according to the invention.

FIG. 7 shows another embodiment of a junction box 35 according to the invention, whereby only three guides 4, 6, 18 are disposed, and whereby only two diodes 1, 28 are arranged. The first diode 1 is positioned with a small side on the base plate 76 of the housing 5. The second diode 28 is arranged with a large bottom side on the base plate 76 of the housing 5. Each diode 1, 28 includes a foil strip 2, 3 which is guided to a guide 4, 6, 18. The first guide 4 and the third guide 18 are connected using a first and a second conductor element 36, 37 with a first and a second contact point 33, 34. In the embodiment shown, the first contact point 33 disposes the positive terminal of the junction box 35 and the second contact point 34 disposes the negative terminal of the junction box 35.

In the embodiment shown, three foil conductors 32 of solar cells (not shown) extend to the three guides 4, 6, 18, whereby the foil conductors 32 are electrically connected to the foil strips 2, 3 of the diodes 1, 28.

Figure 8:
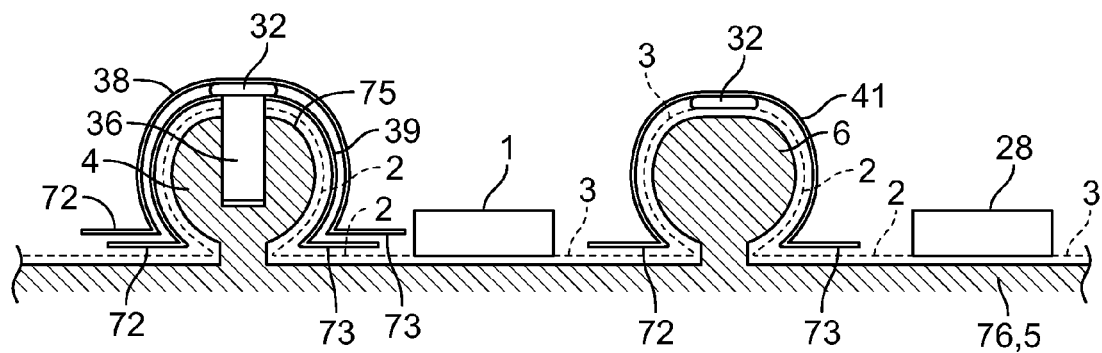
FIG. 8 is a partial cross-sectional view through a first and a second guide of the junction box of FIG. 7.

FIG. 8 shows the first and second guide 4, 6 of the junction box 35 of FIG. 6. A first foil strip 2 extends from the first diode 1 to the guide 4. The guide 4 includes a cylindrical guiding surface 75 to which the foil strip 2 is attached by means of a second clamp 39. A foil conductor 32 is arranged on the second clamp 39. A first clamp 38 is attached onto the second clamp 39 securing the foil conductor 32 onto the second clamp 39. The second clamp 39 is made of electrically conductive material and includes a first conductor element 36 extends and connects to the first contact point 33.

A second foil strip 3 of the first diode 1 extends to the second guide 6 and is attached to the cylindrical guiding surface 75 of the second guide 6. On an upper side of the second guide 6, a foil conductor 32 is disposed on the second foil strip 3. A third clamp 41 is arranged on the second guide 6 fixing the foil conductor 32 onto the second foil strip 3 of the first diode 1. The second diode 28 includes a first and a second foil strip 2, 3, whereby the first foil strip 2 is guided to the second guide 6 and at least partially bent over the guiding surface 75 of the second guide 6. The second foil strip 3 of the first diode 1 and the first foil strip 2 of the second diode 28 may overlap being directly in contact.

In another embodiment, the second foil strip 3 of the first diode 1 and the first foil strip 2 of the second diode 28 may only cover different parts of the guiding surface 75 being connected by the electrically conductive third clamp 41. The third clamp 41 connects the first and the second foil strip 2, 3 of the second or respectively the first diode 28, 1 with the foil conductor 32. However, the foil conductor 32 may directly lie on the first and/or second foil strip 2, 3. The first and the third clamp 38, 41 may have the same shape. The first and the third clamp 38, 41 may have at least partially the same shape in cross-section as the guiding surface 75 of the respective guide 4, 6. This allows the first and/or the second foil strip 2, 3 with a large face to bias against the guiding surface 75, against each other and against the first and/or third clamp 38, 41. The result is a strong fastening of the foil strips on the guides 4, 6 and a good electrical connection between the foil strips 2, 3 and between a foil strip and a clamp 38, 41. The ends 73, 74 of the clamps allow to press the foil strip 2, 3 against the base plate 76. This improves the fastening of the foil strips 2, 3.

In the embodiment shown in FIG. 8, the guide 4 and the second guide 6 are integrally formed with the housing 5 in an unmovable manner. However, depending on the embodiment, the guide 4 and the second guide 6 may also be fixed to the housing 5 in a slidable manner, as explained in the embodiment of FIG. 5.

Figure 9:
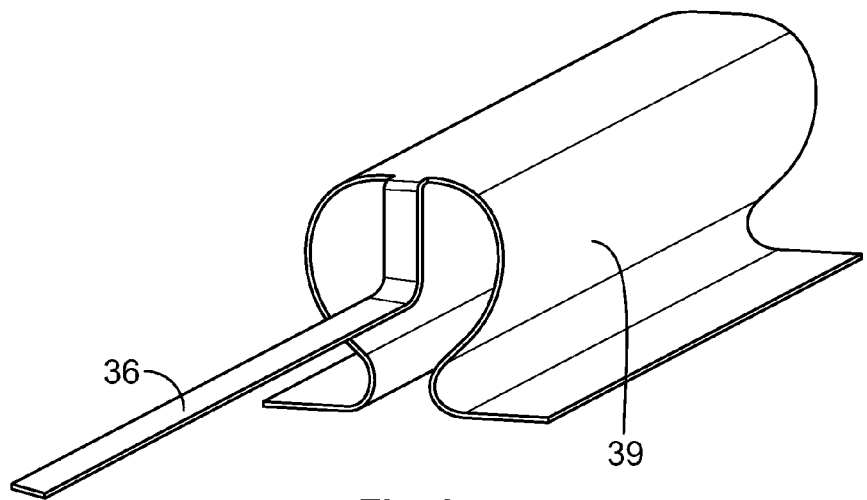
FIG. 9 is a perspective view of a further embodiment of a clamp according to the invention.

FIG. 9 shows a second clamp 39 which has basically the shape of the first clamp 38 of FIG. 2, whereby the first conductor element 36 extends from an upper part of the second clamp 39. The first conductor element 36 has the shape of a small stripe which is disposed for contacting the first or the second contact point 33, 34.

Figure 10:
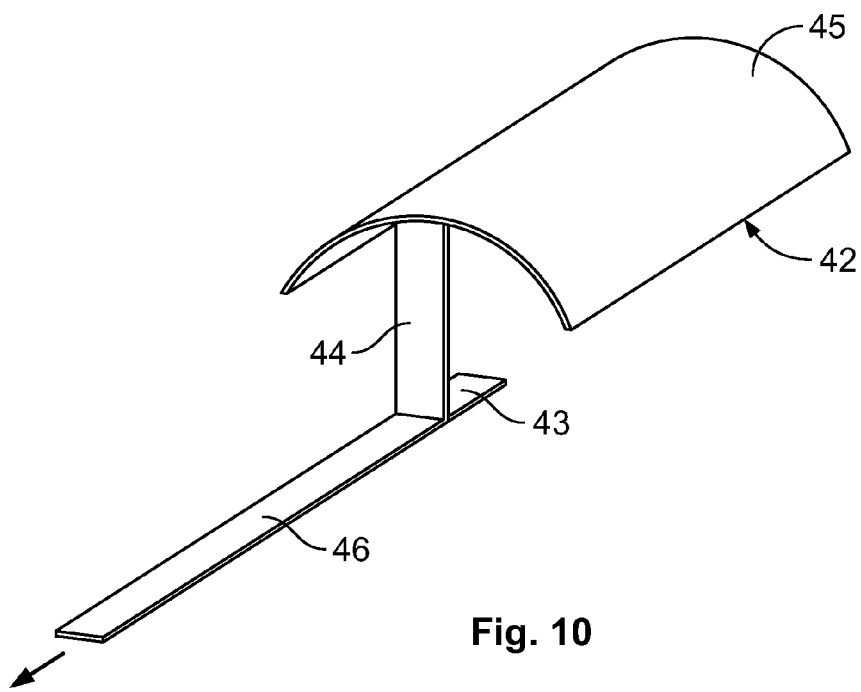
FIG. 10 is a perspective view of a further embodiment of a clamp.

FIG. 10 depicts a further embodiment of a fourth clamp 42 according to the invention. The fourth clamp 42 includes a fixing section 43 that is secured to a respective guide. The fixing section 43 is connected with a contact part 45 by means of a connecting strip 44. The contact part 45 may have a spherical or a partially cylindrical shape. The contact part 45 is used for electrically contacting the foil strips 2, 3 and/or for fastening the foil strips 2, 3 to the guide. Additionally, the connecting strip 44 is connected to a second connecting strip 46, which is disposed for contacting a first and/or a second contact point 33, 34.

Figure 11:
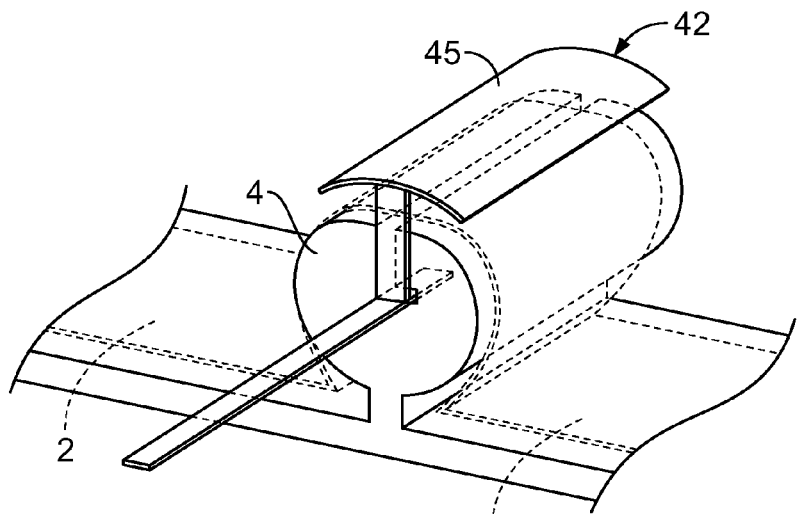
FIG. 11 is a perspective view of the clamp of FIG. 10 secured to a guide.

FIG. 11 shows a fourth clamp 42 according to the invention, which is secured to a first guide 4. A first and a second foil strip 2, 3 are disposed between the contact part 45 and the guide 4, and overlap under the contact part 45. The contact part 45 is pushed by the connecting strip 44 against the first and/or second foil strip 2, 3.

Figure 12:
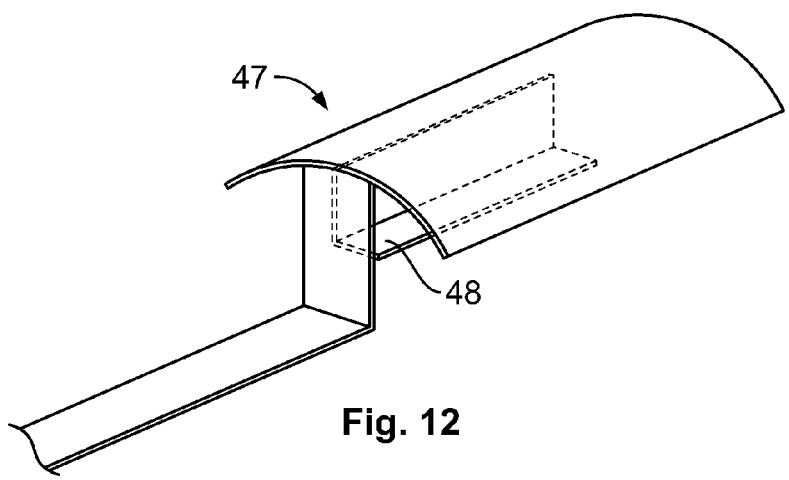
FIG. 12 is a perspective view of a further embodiment of a clamp according to the invention.
Figure 13:
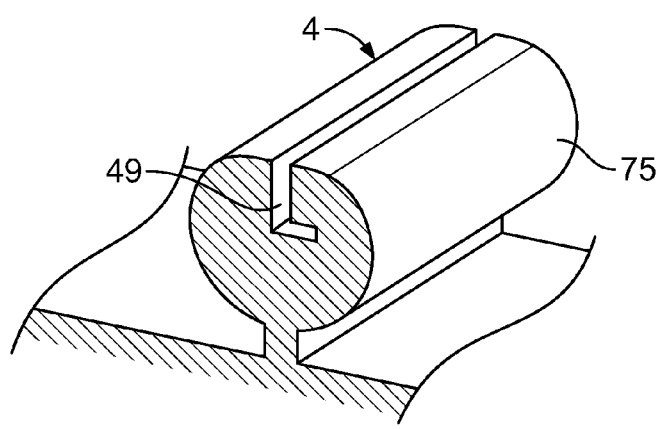
FIG. 13 is a sectioned perspective view of a guide that can be used for securing the clamp of FIG. 12.

FIG. 12 shows a fifth clamp 47 according to the invention, the fifth clamp 47 having basically the same shape as the fourth clamp 42 and a second fixing section 48 that is arranged at a lower face of the contact part 45. The second fixing section 48 has a cross-sectional shape of an L which is arranged and fastened in a mounted position in an L-shaped recess 49 of a guide 4 as depicted in FIG. 13. In this embodiment, the first and second foil strips 2, 3 are guided from two opposite sides on the guiding surface 75 of the guide 4 until the second fixing section 48 and are electrically connected to each other via the contact part 45.

Figure 14:
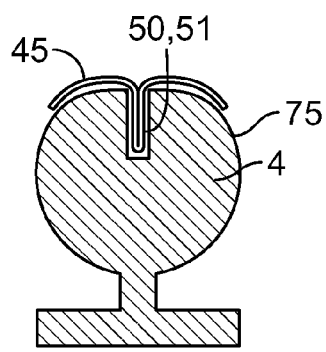
FIG. 14 is a sectional view of a further embodiment of a clamp according to the invention.

FIG. 14 shows a further embodiment of a sixth clamp 50 according to the invention, which has a third fixing section 51 in the shape of a bar which extends from a lower side of a contact part 45. The third fixing section 51 is arranged in a respective recess after the guide 4 and is fixed with the guide 4. The contact part 45 is pre-tensioned on the guiding surface 75 of the guide 4. For fixing and electrically connecting a first and a second foil strip 2, 3 of two different diodes 1, 28, the first and the second foil strip 2, 3 are arranged at opposite sides of the third fixing section 51 between the contact part 45 and the guiding surface 75 of the guide 4.

Figure 15:
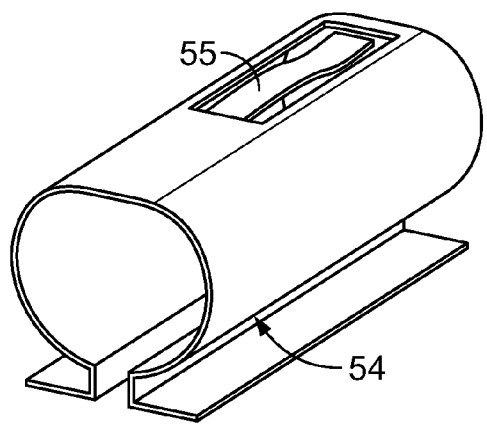
FIG. 15 is a perspective view of a further embodiment of a clamp according to the invention.

FIG. 15 shows a seventh clamp 54 according to the invention, which has basically the same shape as the first clamp 38 and another contacting strip 55 on an upper face of the seventh clamp 54. The contacting strip 55 is bent back on the upper face of the seventh clamp 54 and used for contacting another conductor, e.g. a foil conductor 32.

Figure 16:
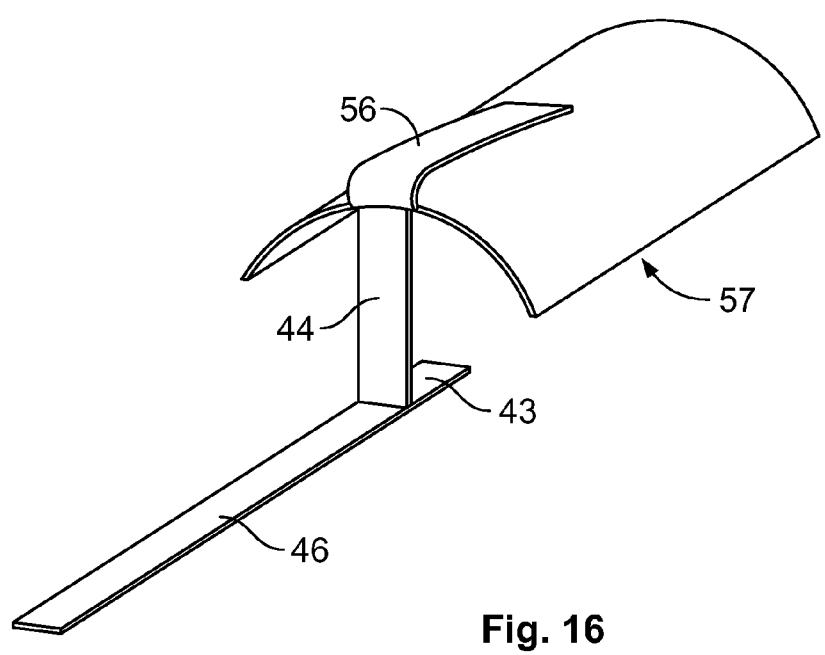
FIG. 16 is a perspective view of a further embodiment of a clamp according to the invention.

FIG. 16 shows an eighth clamp 57 according to the invention, which has basically the shape of the clamp of FIG. 10. However, an additional contact part 56 is disposed on an upper side of the eighth clamp 57, and is in the shape of a clip.

Figure 17:
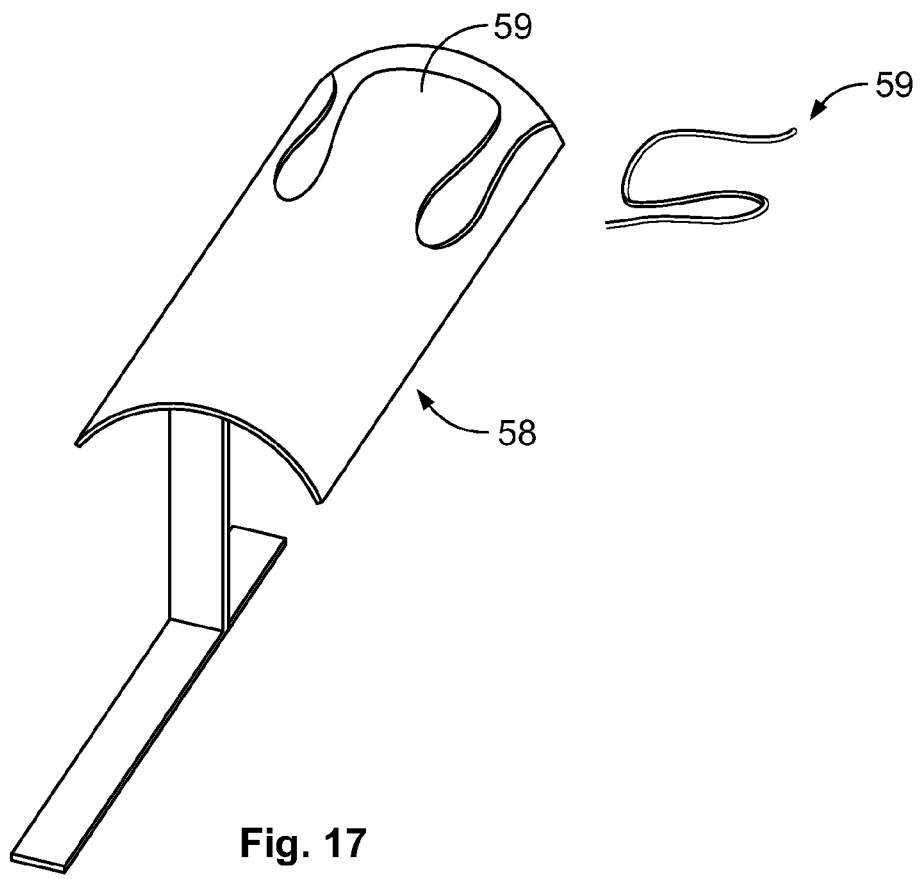
FIG. 17 is a perspective view of a further embodiment of a clamp according to the invention.

FIG. 17 shows a ninth clamp 58 according to the invention, which has basically the same shape as the fourth clamp 42 of FIG. 10 and additionally includes an S-bended second clip 59 on an upper face. The S-bended second clip 59 is used for electrically contacting another conductor, for example a foil conductor 32 of a solar cell. The second clip 59 is further illustrated in a separate drawing.

Figure 18:
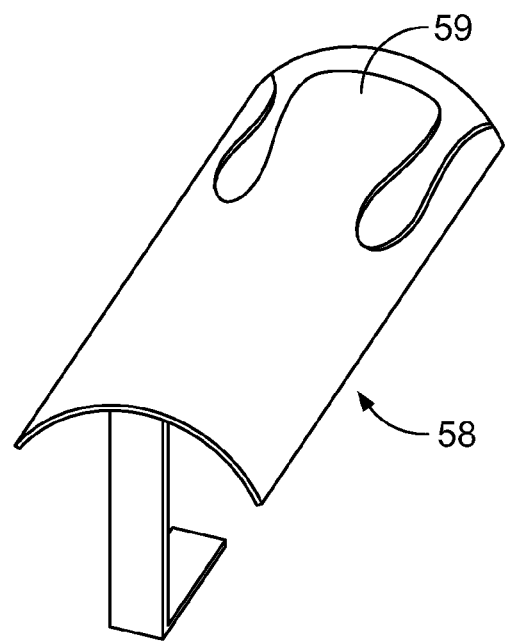
FIG. 18 is a perspective view of a further embodiment of a clamp according to the invention.

FIG. 18 shows a ninth clamp 58 according to the invention, whereby the second connecting strip 46 is not arranged.

The disclosed clamps may be made of electrically conductive material, e.g. steel, such as spring steel. However, the clamps could also be made of plastic.

Figure 19:
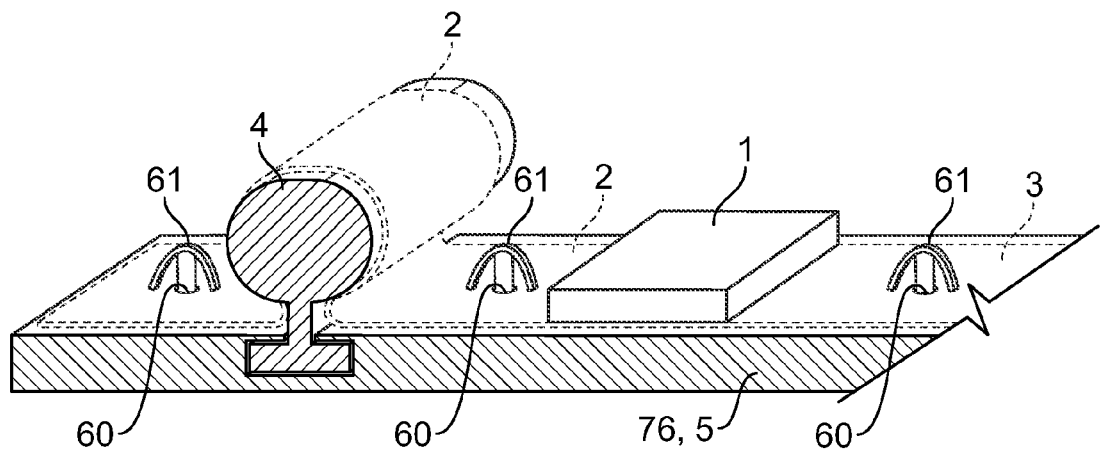
FIG. 19 is a sectioned perspective view of foil strips according to the invention secured by plastic clips.

FIG. 19 illustrates a first securing mechanism for securing the first and/or second foil strip 2, 3 to the housing 5. In this first embodiment, the foil strips include openings 60 into which plastic clips 61, in the shape of barbed hooks, extend. The plastic clips 61 are secured to the base plate 76 of the housing 5. Therefore, the first and the second foil strip 2, 3 are secured onto a base plate of the housing 5 by plastic clips.

Figure 20:
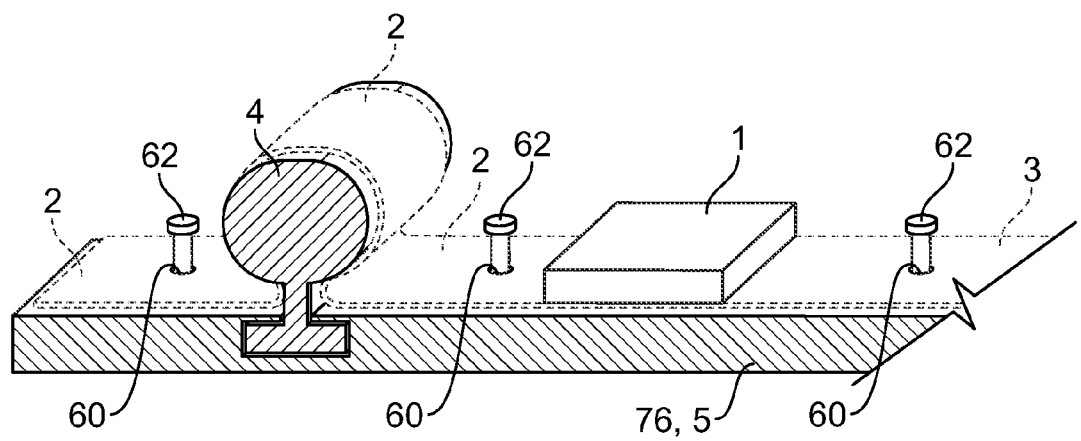
FIG. 20 is a sectioned perspective view of foil strips according to the invention secured by plastic pins.

FIG. 20 shows a second securing mechanism for securing the first and/or the second foil strip 2, 3 to the housing 5. In the embodiment shown, pins 62 extend from the base plate 76 and are guided through openings 60 of the first and/or the second foil strip 2, 3. Pins 62 can be glued to the foil strip 2/3 or the pins 62 are made of plastic and can thus be melted in a section above the foil strip 2, 3 to broaden the diameter and to secure the first and the second foil strip to the housing 5.

In another embodiment, the foil strips 2, 3 may be glued onto the housing and/or the guides.

Figure 21:
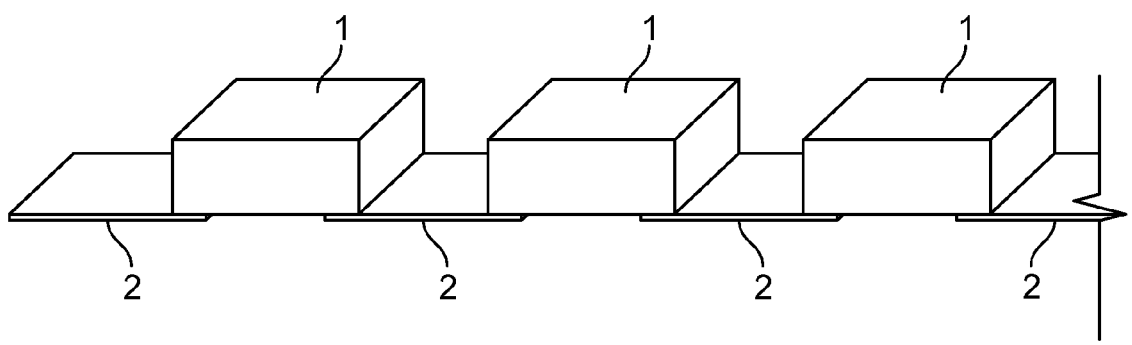
FIG. 21 is a perspective view of an embodiment of connecting several diodes with a foil strip according to the invention.

According to another embodiment, as shown in FIG. 21, two adjacent diodes 1 are connected by a single foil strip 2. By using such a configuration of diodes the clamps as described with regard to FIG. 8 would clamp a single foil strip while connecting said foil strip to the foil conductor 32. The diodes 1 according to this embodiment are thus connected to a single foil strip 2 thereby providing a diode chain.

Figure 22:
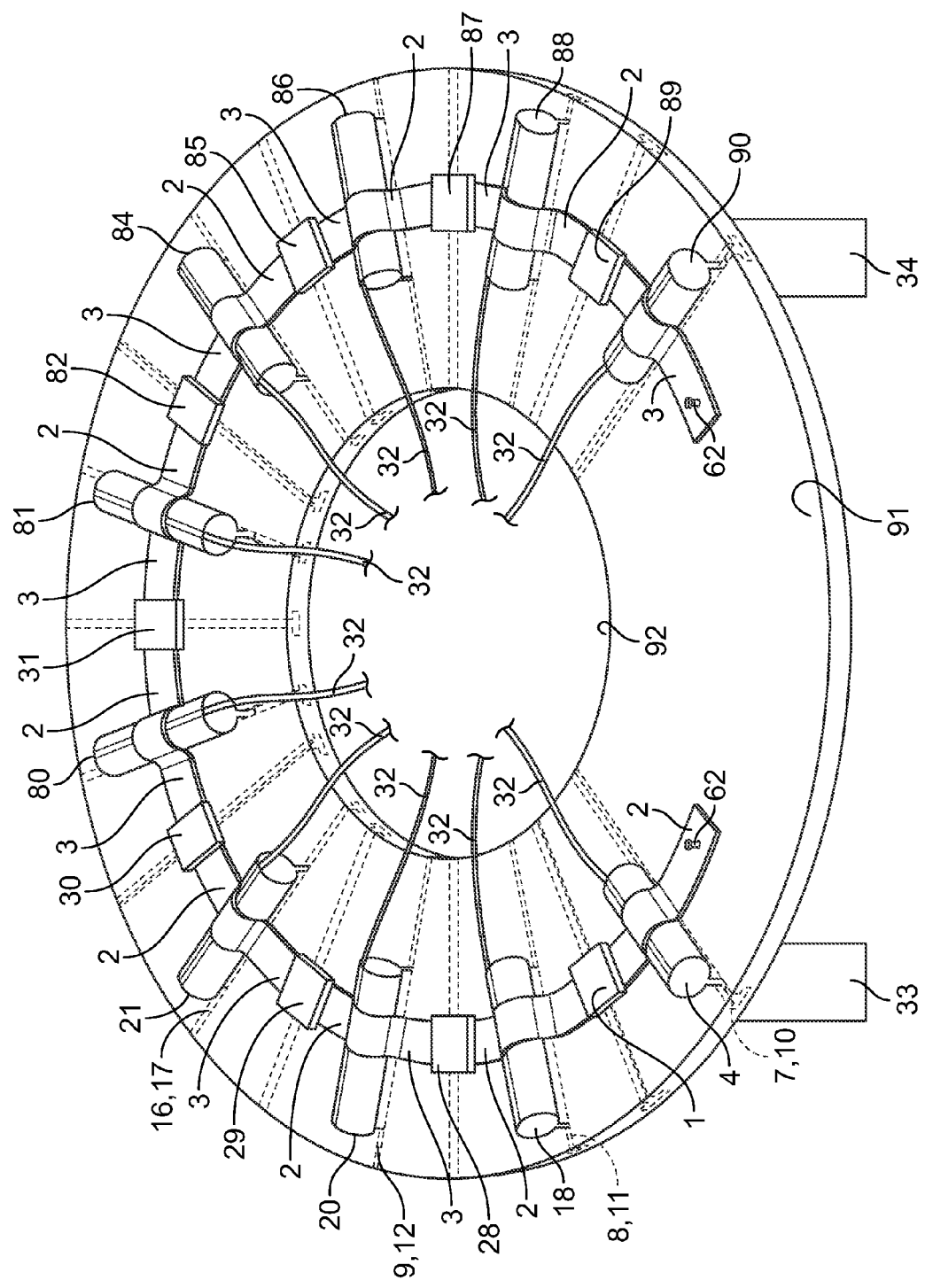
FIG. 22 is a perspective view of an embodiment with a ring chain of diodes according to the invention.

FIG. 22 shows an embodiment of another base plate 91 of a housing which has the shape of a ring plate with a central opening 92. Several foil conductors 32 of solar cells are guided through the central opening 92 to the guides 4, 18, 20, 21, 80, 81, 84, 86, 88, 90. The guides may all have the same structure and form as the guide 4 of FIG. 3. The guides may be moveably connected to the base plate 91 via receiving passageways 7, 8, 9, 16 and respective receiving slots 10, 11, 12, 17 as explained in the embodiment of FIG. 5. In the depicted embodiment of FIG. 22, the guides are moveably connected to the base plate 91 in radial directions referring to a center point of the central opening 92. The diodes 1, 28, 29, 30, 31, 82, 85, 87, 89 are disposed in a chain with the shape of a ring around the center point of the central opening 92. The diodes 1, 28, 29, 30, 31, 82, 85, 87, 89 are connected by first and second foil strips 2, 3. In another embodiment, the guides 4, 18, 20, 21, 80, 81, 84, 86, 88, 90 may be secured to the base plate 91 of a housing of a junction box fixed in an immobile manner.

The first foil strip 2 at one end of the diode chain and the second foil strip 3 at another end of the diode chain are fixed to the base plate 91 by pins 62. The first foil strip 2 of the first end of the diode chain and the second foil strip 3 at the second end of the diode chain dispose two electrical contacts that may be connected to a first and second contact point.

The foil strips 2, 3 of the diodes 1, 28, 29, 30, 31, 82, 85, 87, 89 are guided by the surface of the guides 4, 18, 20, 21, 80, 81, 84, 86, 88, 90. The foil strips 2, 3 may be secured to the guides, for example by glue or by clamps, as discussed in the FIGS. 8 to 18. The clamps are not shown in FIG. 22. Furthermore, the foil strips 2, 3 are electrically connected to the foil conductors 32 at the guides 4, 18, 20, 21, 80, 81, 84, 86, 88, 90. The embodiment of FIG. 22 provides an improved thermal distribution of the heat that is generated by the diodes.

Figure 23:
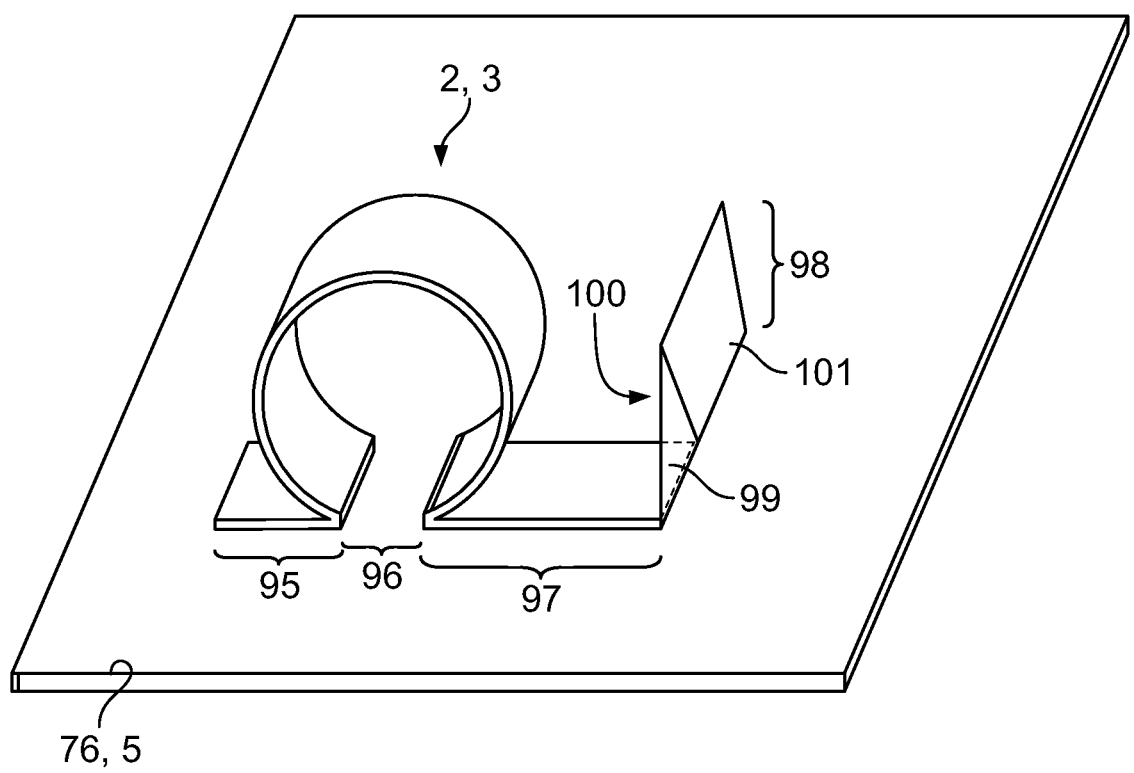
FIG. 23 is a perspective view of an embodiment of a bended foil strip according to the invention.

FIG. 23 depicts another embodiment of a foil strip 2, 3 according to the invention. The embodiment of FIG. 23 shows the flexibility and the design ability of the foil strip 2, 3. The foil strip 2, 3 includes a first section 95 which is arranged parallel to a base plate 76 of a housing of a junction box. The first section 95 extends into a second section 96, in which the foil strip 2, 3 has the shape of a partial ring. The second section 96 extends over to a third section 97, which is arranged in parallel to the first section 95 and in the same plane as the first section 95, in the embodiment shown. Thus the first, second and third section 95, 96, 97 dispose the shape of a Ω(omega).

In the embodiment shown, the third section 97 extends to a fourth section 98, whereby in the fourth section 98 the foil strip is arranged with a small side face on the base plate 76.

The third section 97 goes over to the fourth section 98 over a folded section 99. In the folded section 99 the lower face of the third section 97 is folded to a left side 100 of the fourth section 98 which is disposed at the side of the third section. The upper side of the second section is folded to a right side 101 of the fourth section 98 which is opposite to the omega (Ω)-shape of the first, second and third section 95, 96, 97.

The embodiment of FIG. 23 shows how bendable the foil strips are and what different shapes the foil strips may have. The foil strip is made of a bendable material and can be formed in predetermined shapes by bending, whereby the foil strip stays in the bended form as shown in FIG. 23. Therefore, it is not always necessary to use guides for guiding the foil strips. Depending on the used embodiment, the foil strips can be used without guides for contacting diodes as explained with the previous figures. The foil strip may be made of a thin electrically conductive foil which is for example made of metal.

The invention has the advantage that a junction box for solar cells has guides and diodes, preferably Schottky diodes with legs made from foil strips or surface mounted diodes soldered onto foil strips. The foil strips have the advantage that they are flexible and need less space. Further advantages are that the costs of producing the junction box are reduced. A further advantage is that by using moveable guides, different designs can be devised with the same junction box. Additionally, the stress on the diodes due to bending is reduced by using foil strips as contacts. Furthermore, an improved cooling is achieved by the foil strips. Furthermore, a low profile design is possible.

The foregoing illustrates some of the possibilities for practicing the invention. Many other embodiments are possible within the scope and spirit of the invention. It is, therefore, intended that the foregoing description be regarded as illustrative rather than limiting, and that the scope of the invention is given by the appended claims together with their full range of equivalents.

What is claimed is:

1. A junction box for connecting a solar cell, comprising:
   a housing;
   a diode; and
   a conductive foil strip electrical contact,
   wherein the housing further includes a base plate with a receiving passageway that extends along a slide direction, the receiving passageway opens along an upper side of the base plate through a receiving slot.

2. The junction box according to claim 1, wherein the foil strip is secured to the housing.

3. The junction box according to claim 2, wherein the foil strip is fixed to the housing by a pin or clip.

4. The junction box according to claim 3, wherein the pin or clip protrudes from the foil strip.

5. The junction box according to claim 1, further comprising a guide being connected to the housing and having a guiding surface.

6. The junction box according to claim 5, wherein the foil strip extends over the guiding surface.

7. The junction box according to claim 6, wherein the foil strip is secured to the guide.

8. The junction box according to claim 5, wherein the guide is removably connected to the housing.

9. The junction box according to claim 8, wherein the guide is slidable.

10. The junction box according to claim 5, wherein the guide has a partially spherical guiding surface, the guiding surface supports the foil strip.

11. The junction box according to claim 1, wherein the receiving slot extends along the slide direction, the receiving slot has a smaller width than the receiving passageway along a cross section of the base plate that is perpendicular to the slide direction.

12. The junction box according to claim 11, wherein the guide further includes a foot plate that is positioned in the receiving passageway, the foot plate is broader than the receiving slot and directs the guide in the receiving passageway in a slidable manner along the slide direction.

13. The junction box according to claim 1, further comprising a conductor of the solar cell wherein the conductor connects to the foil strip.

14. The junction box according to claim 13, wherein the conductor is secured to the guide by a clamp.

15. The junction box according to claim 14, wherein the clamp secures to the guide and electrically connects to the foil strip.

16. The junction box according to claim 15, wherein the clamp has a conductor element that connects to an electrical contact point.

17. The junction box according to claim 16, wherein the conductor element is positioned along and secured to the guide wherein the conductor element contacts the foil strip along the guide and extends to a contact point.

18. The junction box according to claim 1, further comprising a fixing mechanism for securing the electrically conductive foil strip to a guide.

19. The junction box according to claim 18, wherein the fixing mechanism is a clamp.

20. The junction box according to claim 19, wherein the clamp secures the foil strip on a guiding surface of the guide.

21. The junction box according to claim 20, wherein the clamp has an Ω (omega)-shape.

* * * * *